US012802929B2

(12) United States Patent
Zur

(10) Patent No.: US 12,802,929 B2
(45) Date of Patent: Nov. 17, 2026

(54) ENHANCED DEPOSITION RATE BY APPLYING A NEGATIVE VOLTAGE TO A GAS INJECTION NOZZLE IN FIB SYSTEMS

(71) Applicant: APPLIED MATERIALS ISRAEL LTD., Rehovot (IL)

(72) Inventor: Yehuda Zur, Tel-Aviv (IL)

(73) Assignee: Applied Materials Israel Ltd., Rehovot (IL)

(*) Notice: Subject to any disclaimer, the term of this patent is extended or adjusted under 35 U.S.C. 154(b) by 898 days.

(21) Appl. No.: 17/950,960

(22) Filed: Sep. 22, 2022

(65) Prior Publication Data

US 2024/0105421 A1 Mar. 28, 2024

(51) Int. Cl.
*C23C 14/22* (2006.01)
*C23C 14/04* (2006.01)
(Continued)

(52) U.S. Cl.
CPC ........ *H01J 37/3178* (2013.01); *C23C 14/048* (2013.01); *C23C 14/18* (2013.01);
(Continued)

(58) Field of Classification Search
CPC ............... H01J 37/3178; H01J 37/1474; H01J 37/3005; H01J 2237/006;
(Continued)

(56) References Cited

U.S. PATENT DOCUMENTS 5,683,547 A * 11/1997 Azuma ............. H01L 21/76892 216/37
6,492,261 B2 12/2002 Gavish et al.
(Continued)

FOREIGN PATENT DOCUMENTS

EP 0221184 A1 * 5/1987 ............... G03F 1/74
JP 2012033467 A 2/2012

OTHER PUBLICATIONS

PCT/US2023/072891, "International Preliminary Report on Patentability", Apr. 3, 2025, 7 pages.
(Continued)

*Primary Examiner* — Dah-Wei D. Yuan
*Assistant Examiner* — Nga Leung V Law
(74) *Attorney, Agent, or Firm* — Kilpatrick Townsend & Stockton LLP

(57) ABSTRACT

A method of depositing material over a localized region of a sample comprising: positioning a sample within a vacuum chamber such that the localized region is under a field of view of a charged particle beam column; injecting a deposition precursor gas, with a gas injection nozzle, into the vacuum chamber at a location adjacent to the deposition region; generating a charged particle beam with the charged particle beam column and focusing the charged particle beam within the deposition region of the sample; and scanning the charged particle beam across the deposition region of the sample to activate molecules of the deposition gas that have adhered to the sample surface in the deposition region and deposit material on the sample within the deposition region; and applying a negative bias voltage to the gas injection nozzle while the focused ion beam is scanned
(Continued)

across the deposition region to alter a trajectory of the secondary electrons and repel the secondary electrons back to the sample surface.

5 Claims, 7 Drawing Sheets

(51) Int. Cl.

| | |
|---|---|
| ***C23C 14/18*** | (2006.01) |
| ***H01J 37/147*** | (2006.01) |
| ***H01J 37/30*** | (2006.01) |
| ***H01J 37/317*** | (2006.01) |
| ***H10P 14/40*** | (2026.01) |

(52) U.S. Cl.
CPC ........ *C23C 14/221* (2013.01); *H01J 37/1474* (2013.01); *H01J 37/3005* (2013.01); *H10P 14/418* (2026.01); *H01J 2237/006* (2013.01); *H01J 2237/31749* (2013.01)

(58) Field of Classification Search
CPC ..... H01J 2237/31749; H01J 2237/0262; H01J 2237/30405; H01J 2237/31744; C23C 14/048; C23C 14/18; C23C 14/221; C23C 16/047; C23C 16/16; C23C 16/45578; C23C 16/52; H01L 21/28568
See application file for complete search history.

(56) References Cited

U.S. PATENT DOCUMENTS

| | | | | |
|---|---|---|---|---|
| 6,586,736 | B1 * | 7/2003 | McCord .................. | H01J 37/28 250/397 |
| 6,670,610 | B2 | 12/2003 | Shemesh et al. | |
| 6,992,288 | B2 | 1/2006 | Cafri et al. | |
| 8,604,446 | B2 | 12/2013 | Pitto | |
| 8,709,269 | B2 | 4/2014 | Shemesh | |
| 2005/0279934 | A1 * | 12/2005 | Stewart ................. | H01J 37/244 250/309 |
| 2011/0215256 | A1 | 9/2011 | Ogawa et al. | |

OTHER PUBLICATIONS

Li, et al., “Study of Temperature Influence on Electron Beam Induced Deposition”, Journal of Vacuum Science & Technology A, vol. 24, No. 3, May/Jun. 2006, pp. 431-436.

Utke, et al., “Nanofabrication Using Focused Ion and Electron Beams: Principles and Applications”, Oxford University Press, Nanomanufacturing Series, ISBN 978-0-19-973421-4, May 2012, 56 pages.

PCT/US2023/072891, “International Search Report and Written Opinion”, Dec. 13, 2023, 11 pages.

* cited by examiner

ENHANCED DEPOSITION RATE BY APPLYING A NEGATIVE VOLTAGE TO A GAS INJECTION NOZZLE IN FIB SYSTEMS

RELATED APPLICATIONS

The present application is related to commonly assigned U.S. application Ser. No. 17/725,023 entitled "Reduced Charging by Low Negative Voltage in FIB Systems" and filed on Apr. 20, 2022. The '023 application is incorporated by reference herein in its entirety for all purposes.

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon, gallium nitride or other type of wafer that includes one or more integrated circuits (ICs) or other electronic structures formed thereon can be milled with a focused ion beam (FIB) and/or analyzed with a scanning electron microscope (SEM) to study specific characteristics of the circuits or other structures formed on the wafer.

FIB and SEM tools are similar in that each includes a charged particle column that generates a charged particle beam and directs the beam towards a sample. As their names imply, however, the charged particle beam generated by an FIB column is a focused beam of ions while the charged particle beam generated by an SEM column is a focused beam of electrons.

While FIB and SEM tools (as well as FIB-SEM tools, which include both a FIB column and a SEM column) are often used for analyzing and otherwise evaluating structures within a specimen, the tools can also be used for etching or depositing material on a specimen. For example, a focused ion beam can be scanned across a surface of a sample while a gas injection system directs a flow of a deposition precursor gas to the scanned area to selectively deposit material, with nanometer precision, in the scanned area according to a technique that is often referred to as focused ion beam enhanced deposition or FIB-enhanced deposition for short. During a FIB-enhanced deposition process, molecules of the injected gas adhere to a surface of the sample. As the ion beam is scanned across a region of the sample, the energy released by the collision cascade of the bombarding ions causes dissociation of the surface-adsorbed precursor molecules, resulting in solid deposition on the surface together with the release of volatile residues. As another example, a deposition gas can be introduced to a sample in the vicinity in which an electron beam is scanned across the surface of a sample in order to deposit material under an SEM column.

While FIB-enhanced deposition has been used in many different instances and applications, improved deposition techniques are continuously being sought.

BRIEF SUMMARY OF THE INVENTION

Embodiments of the disclosure pertain to an improved method and system for charged particle beam enhanced deposition, such as focused ion beam enhanced deposition. Embodiments can be used to increase the deposition rate of charged particle beam enhanced deposition and thereby increase the throughput of processes that employ charged particle beam enhanced deposition. While embodiments of the disclosure can be used to increase the rate at which materials are deposited over a variety of different types of samples, some embodiments are particularly useful in depositing materials over samples that are semiconductor wafers or similar specimens.

In some embodiments, a method of depositing material over a sample in a localized region of the sample is provided. The method can include: positioning a sample within a vacuum chamber such that the localized region is under a field of view of a charged particle beam column; injecting a deposition precursor gas, with a gas injection nozzle, into the vacuum chamber at a location adjacent to the deposition region; generating a charged particle beam with the charged particle beam column and focusing the charged particle beam within the deposition region of the sample; and scanning the charged particle beam across the deposition region of the sample to activate molecules of the deposition gas that have adhered to the sample surface in the deposition region and deposit material on the sample within the deposition region; and applying a negative bias voltage to the gas injection nozzle while the focused ion beam is scanned across the deposition region to alter a trajectory of the secondary electrons and repel the secondary electrons back to the sample surface.

In various implementations, the method can include one or more of the following features. The charged particle beam column can be a focused ion beam column and the charged particle beam can be a focused ion beam. The gas injection nozzle can be positioned between a tip of the charged particle column and the sample. The gas injection nozzle can include a channel formed through a distal end of the nozzle that is aligned to allow the focused ion beam to pass through the channel to the sample. The step of applying a negative bias voltage to the gas injection nozzle can apply a voltage of between negative 50 and negative 1000 volts or between negative 100 and negative 500 volts. The sample can be a semiconductor wafer.

In some embodiments a system for depositing material over a sample in a localized region of the sample is provided. The system can include: a vacuum chamber; a sample support configured to hold a sample within the vacuum chamber during a deposition operation; a charged particle beam column configured to direct a charged particle beam into the vacuum chamber toward the region of the sample during the deposition operation; a gas injection nozzle configured to introduce a deposition gas to a surface of the sample during the deposition operation; and a voltage source operable to apply a negative bias voltage to the gas injection nozzle during a localized deposition process.

In still other embodiments a non-transitory computer readable memory is provided. The computer-readable memory can include a plurality of computer-readable instructions that, when executed by one or more processors, cause the processors to: position a sample within a vacuum chamber such that the localized region is under a field of view of a charged particle beam column; inject a deposition precursor gas, with a gas injection nozzle, into the vacuum chamber at a location adjacent to the deposition region; generate a charged particle beam with the charged particle beam column and focusing the charged particle beam within the deposition region of the sample; scan the charged particle beam across the deposition region of the sample to activate molecules of the deposition gas that have adhered to the sample surface in the deposition region and deposit material on the sample within the deposition region; and apply a negative bias voltage to the gas injection nozzle while the focused ion beam is scanned across the deposition region to alter a trajectory of the secondary electrons and repel the secondary electrons back to the sample surface.

To better understand the nature and advantages of the present disclosure, reference should be made to the following description and the accompanying figures. It is to be understood, however, that each of the figures is provided for the purpose of illustration only and not drawn to scale and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure pertain to an improved method and system for charged particle beam enhanced deposition, such as focused ion beam enhanced deposition. Embodiments can be used to increase the deposition rate of charged particle beam enhanced deposition and thereby increase the throughput of processes that employ charged particle beam enhanced deposition.

Example Focused Ion Beam (FIB) Tool

Figure 1:
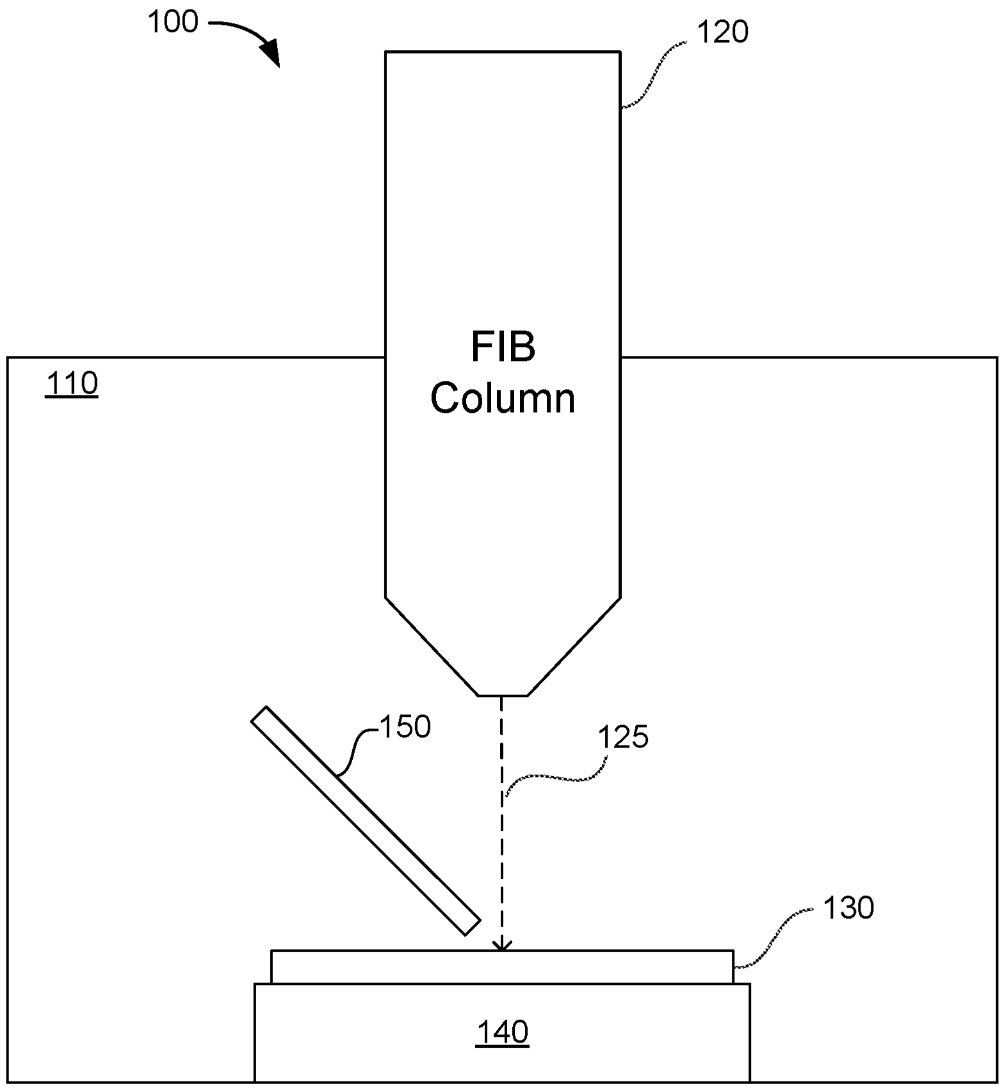
FIG. 1 is a simplified illustration of a sample focused ion beam (FIB) evaluation system according to some embodiments of the disclosure.

In order to better understand and appreciate the disclosure, reference is first made to FIG. 1, which is a simplified schematic illustration of a focused ion beam (FIB) evaluation system 100. FIB system 100 can be used for, among other operations, particle enhanced deposition of various materials over semiconductor wafers.

As shown in FIG. 1, system 100 can include, among other elements, a vacuum chamber 110 along with a a focused ion beam (FIB) column 120. A supporting element 140 can support a sample 130 (e.g., a semiconductor wafer) within chamber 110 during a processing operation in which the sample 130 (sometimes referred to herein as an "object" or a "specimen") is subject to a charged particle beam from FIB column 120.

During a processing operation, one or more gases can be delivered into chamber 110 by a gas injection system 150 for certain operations. For simplicity of explanation gas injection system 150 is illustrated in FIG. 1 as a nozzle, but it is noted that gas injection system 150 can include gas reservoirs, gas sources, valves, one or more inlets and one or more outlets, among other elements. In some embodiments gas injection system 150 can be configured to deliver gas to a localized area of sample 130 that is exposed to the scan pattern of the charged particle beam as opposed to delivering gas to an entire upper surface of the sample. For example, in some embodiments gas injection system 150 has a nozzle opening diameter measured in hundreds of microns (e.g., between 400-500 microns) that is configured to deliver gas directly to a relatively small portion of the sample's surface that encompasses the charged particle beam scan pattern.

FIB column 120 is connected to vacuum chamber 110 so that the charged particle beam generated by the FIB column propagates through a vacuumed environment formed within vacuum chamber 110 before impinging on sample 130. For example, as shown in FIG. 1, FIB column 120 can generate a focused ion beam 125 that travels through the vacuum environment of chamber 110 before colliding with sample 130.

FIB column 120 can mill (e.g., drill a recess in) sample 130 by irradiating the sample with charged particle beam 125 to form a cross section and, if desired, can also smooth the cross section. An FIB milling process typically operates by positioning the specimen in a vacuum environment and emitting a focused beam of ions towards the specimen to etch or mill away material on the specimen. In some instances the vacuum environment can be purged by controlled concentration of background gases that serve to help control the etch speed and quality or help control matter deposition. The accelerated ions can be generated from Xenon, Gallium or other appropriate elements and are typically accelerated towards the specimen by voltages in the range from 500 volts to 100,000 volts, and more typically falling in the range from 3,000 volts to 30,000 volts. The beam current is typically in the range from several pico amps to several micro amps, depending on the FIB instrument configuration and the application, and the pressure is typically controlled between $10^{-10}$ to $10^{-5}$ mbar in different parts of the system and in different operation modes.

A milling process can be done by, for example: (i) locating a location of interest that should be milled in order to remove a portion (e.g., a portion of one or more layers) of material from the sample, (ii) moving the sample (e.g., by the mechanical supporting element 140) so that the sample is located under the field-of-view of the FIB unit, and (iii) milling the sample to remove a desired amount of material in the location of interest. The milling process can include forming a recess in the sample (usually sized a few microns to few hundreds of microns in the lateral dimensions).

The milling process typically includes scanning a charged particle beam back-and-forth (e.g., in a raster or other scan pattern) across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of 150, 200 or 300 mm while each area scanned on the wafer (i.e., the area milled) can be a rectangular area having a width and/or length measured in microns or tens of microns. Each iteration (or frame) in which the ion beam is scanned across the region being milled is typically measured in microseconds and removes a very small amount of material (e.g., as low as 0.01 atomic layers using a low i-probe (e.g., 10 pA) or as much as 1000 atomic layers using a high i-probe (e.g., 1000 nA) such that the scan pattern is repeated many thousands or even millions of times to etch a hole to a desired depth.

During a milling operation the charged particle beam 120 generated by FIB column 120 propagates through the vacuumed environment formed within vacuum chamber 110 before impinging on sample 130. The milling process generates byproducts such as molecules, atoms and ions of the material being milled along with secondary electrons. For example, as an ion hits the sample surface with a relatively high energy level, the ion can begin a collision cascade that transfers momentum and energy from the ion to the sample until the ion is stopped and implanted. The momentum and energy transfer during the collision cascade can cause the dislocation of atoms, the ionization of atoms and the generation of phonons (heat). The cascade can reach the sample surface causing the sputtering of atoms having enough momentum and energy to escape the solid sample and generating secondary ions and electrons as a combination of ionization and sputtering that also escape the sample surface. The secondary ions or secondary electrons can be detected by an appropriate detector (not shown). The detected secondary ions or secondary electrons can then be used to analyze characteristics of the milled layers and the structure.

While not shown in FIG. 1, FIB system 100 can include one or more controllers, processors or other hardware units that control the operation of system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Figure 2:
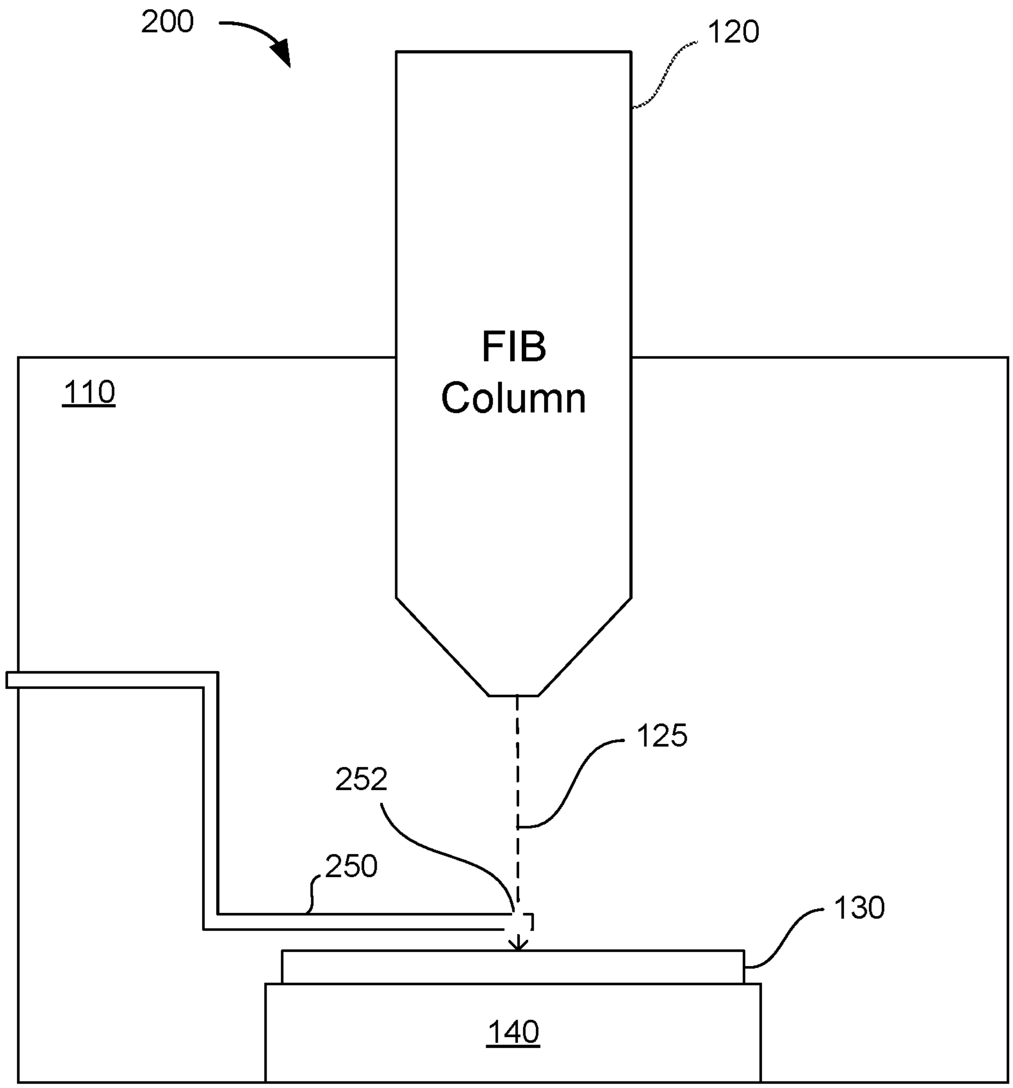
FIG. 2 is a simplified illustration of a sample focused ion beam (FIB) evaluation system according to some embodiments of the disclosure.

FIG. 2 is a simplified schematic illustration of a portion of another focused ion beam (FIB) evaluation system 200 according to some embodiments. System 200 is to system 100 and the same reference numbers are used in FIG. 2 to indicate similar or identical components as those shown in FIG. 1. System 200, however, includes a gas injection nozzle 250 that is positioned directly between FIB column 120 and sample 130. In order to allow focused ion beam 125 to reach sample 130, gas injection nozzle 250 can include a hole or channel 252 formed through the gas injection nozzle that allows ion beam 125 to pass through the gas injection nozzle and collide with sample 130 at a location directly below the nozzle. One suitable example of a gas injection nozzle that can be employed as nozzle 250 is described in U.S. Pat. No. 6,992,288, which is incorporated by reference herein in its entirety for all purposes.

In some embodiments, each of gas injection nozzles 150 and 250 can be in a fixed relationship in the X and Y planes with respect to FIB column 120 and moveable within the Z plane to allow the nozzle to get in close proximity (e.g., as close as 300 microns in some embodiments) to an upper surface of sample 300. Thus, gas injection nozzles 150 and 250 can typically be positioned much closer to the surface during a processing operation than can the tip of FIB column 120.

Charged Particle Enhanced Deposition Process

Some embodiments of the disclosure can deposit material over a sample positioned on a sample support by initiating a deposition process under the FIB column. As an example, in some embodiments FIB column 120 can be used in a deposition mode to initiate a focused ion beam enhanced deposition process. Towards this end, a deposition gas can be supplied to the sample 130 by gas injection nozzle 150 or 250 and some molecules of the deposition gas can adhere to the surface of the sample. Energy from the FIB column 120 can generate a beam of ions 125 that can be focused into a deposition zone of the sample. The cascade of impinging ions can, in turn, activate molecules of the deposition gas that have adhered to the sample surface resulting in deposition of material on the sample that is localized to the regions of the sample over which the ion beam is scanned. Thus, deposition that occurs according to such embodiments does not simultaneously occur across the entire surface of the sample or wafer being processed. Instead, deposition occurs only in the general areas where the ion beam (which, as a non-limiting example, can have a diameter in the range of 0.5 to 25 microns for a xenon plasma) impinges upon the wafer and as the ion beam is scanned across those areas of the wafer. Thus, deposition according to some embodiments can be carried out with micron level resolution.

The rate at which material is deposited in such a focused ion beam (FIB) enhanced deposition process can have a direct impact on the throughput of the process. Thus, higher deposition rates can equate to a higher throughput. During a FIB deposition process, the rate at which material is deposited over the sample depends on a number of different factors including the energy level of the charged particle beam, the type of material on the surface of the sample, the temperature of the sample surface and the precursor gas used for the deposition process.

As described in more detail below, embodiments of the present invention can increase the deposition rate by applying a negative voltage to the gas injection nozzle, which is made from an electrically conductive material, during an FIB deposition process. The negative voltage can repel secondary electrons that are ejected from the sample (e.g., due to a collision with the focused ion beam) back towards sample. The repelled electrons can then cause additional dissociation events at or near the sample surface which, in turn, can lead to an increase in the deposition rate of the process.

Figure 3:
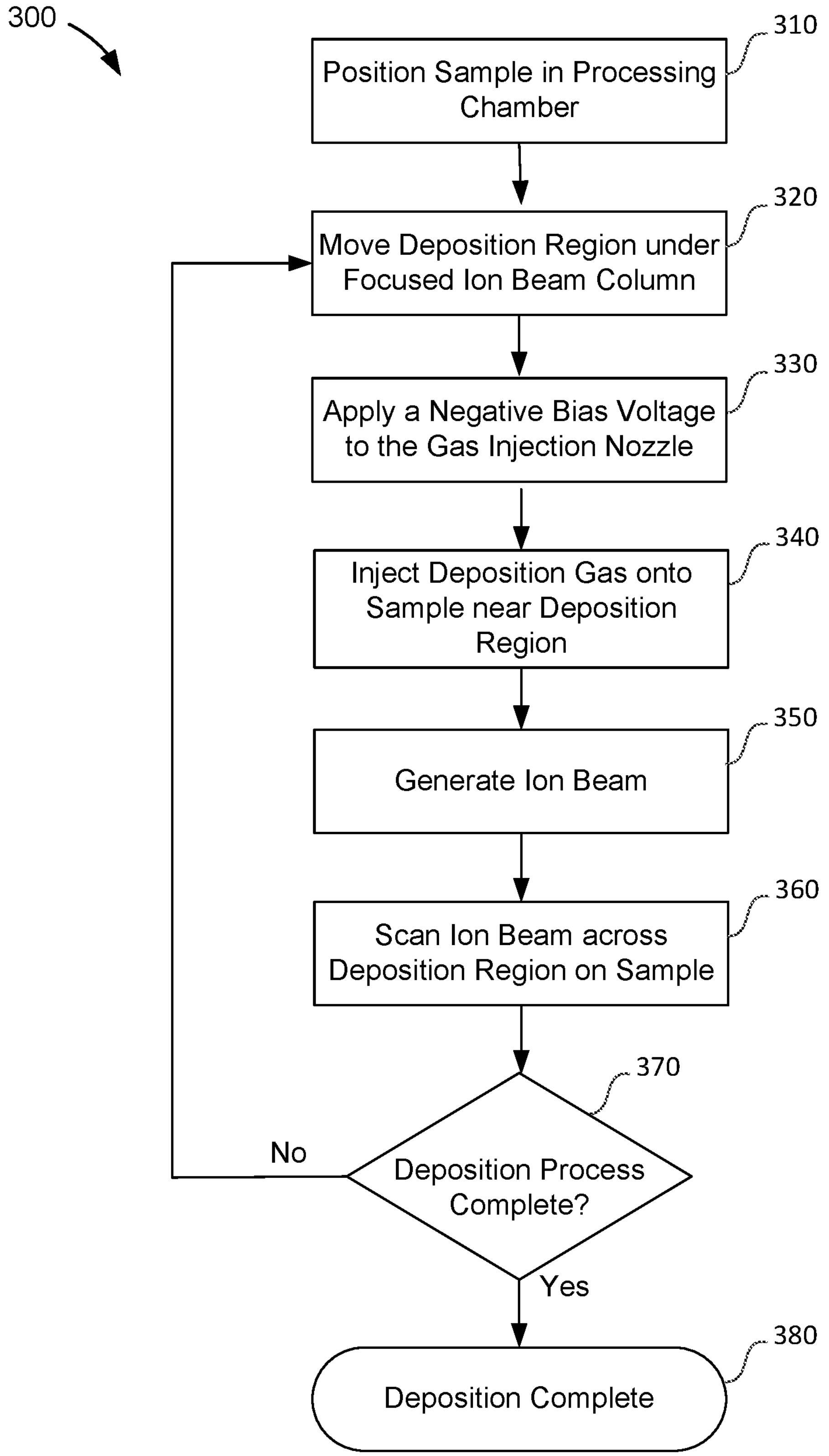
FIG. 3 is a simplified flow chart depicting steps associated with a method of depositing material over a sample according to some embodiments.
Figure 4:
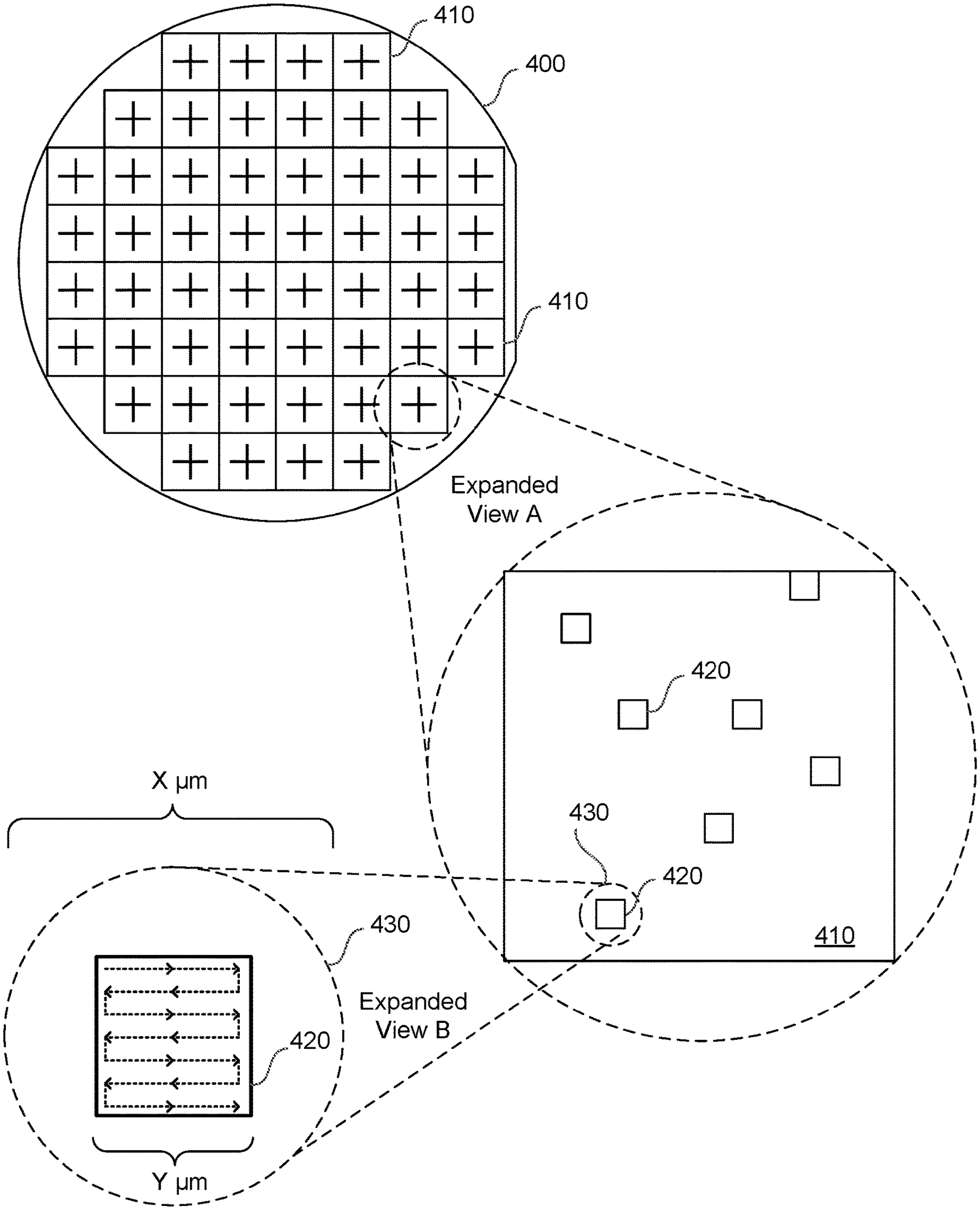
FIG. 4 is a simplified illustration of an area on a semiconductor wafer on which material can be deposited according to embodiments disclosed herein.

Increasing the Deposition Rate of a Charged Particle Enhanced Deposition Process In order to promote a higher deposition rate, and thus a higher throughput rate, some embodiments of the disclosure can apply a negative voltage to the gas injection nozzle during a charged particle enhanced deposition process. To illustrate, reference is made to FIGS. 3 and 4 where FIG. 3 is a simplified flow chart depicting steps associated with a method 300 of depositing material over a sample according to some embodiments and FIG. 4 is a simplified illustration of a sample 400 that can be representative of sample 130 shown in FIGS. 1 and 2. Method 300 starts by positioning a sample within a processing chamber of a sample evaluation system (block 310). The processing chamber, which can be, for example, chamber 100, can include one or more charged particle beam columns that can be operated in a deposition mode to deposit material over sample 400 in one or more localized regions. Block 310 can include positioning the sample within the vacuum chamber on a sample support, such as support 140.

In many instances, sample 400 will include multiple different regions in which material is to be deposited. For example, FIG. 4 depicts a top view of a sample 400 along with two expanded views of specific portions of sample 400. Sample 400 can be, for example, a 150 mm, a 200 mm or a 300 mm semiconductor wafer, and can include multiple integrated circuits 410 (fifty two in the example depicted) formed thereon. The integrated circuits 410 can be at an intermediate stage of fabrication and method 300 can be used to deposit material over one or more regions 420 of the integrated circuits. For example, Expanded View A of FIG. 4 depicts multiple regions 420 of one of the integrated circuits 410 over which material can be deposited according to the techniques described herein. Expanded View B depicts one of those regions 420 in greater detail and dotted line 430 represents the area within integrated circuit 410 that is directly an opening of the gas nozzle during a charged particle deposition process in accordance with some embodiments.

Referring back to FIG. 3, support 140 can be moved to position such that an area in which material is to be deposited over the sample (e.g., one of regions 420, referred to herein as a "deposition region") is placed directly under the tip of the focused ion beam column (block 320). Next, a negative bias voltage is applied to the gas injection nozzle (block 330) and a deposition precursor gas can be injected into the chamber 110 at a location proximate the deposition region by, for example, gas injection system 150 (block 340). During block 340 molecules of the deposition precursor gas adhere to the surface of the sample in accordance with the sticking coefficient of the precursor gas.

While gas is being delivered to the deposition region and while a negative voltage is applied to the gas injection nozzle, the charged particle beam (e.g., an ion beam) can be generated (step 350) and focused and scanned across a region of interest on the sample (step 360). The charged particle beam can be focused by a focusing lens and scanned across a region of the substrate with one or more deflecting lenses (not shown). As discussed above, the cascade of charged particles from beam 125 can activate molecules of the deposition gas that have adhered to the sample in the deposition region resulting in deposition of material on the sample that is localized to the regions of the sample that over which the ion beam is scanned. For example, the charged particle beam can dissociate the precursor gas breaking the gas down into volatile and non-volatile components where the non-volatile component remains on the surface of the sample as deposited material.

Figure 5:
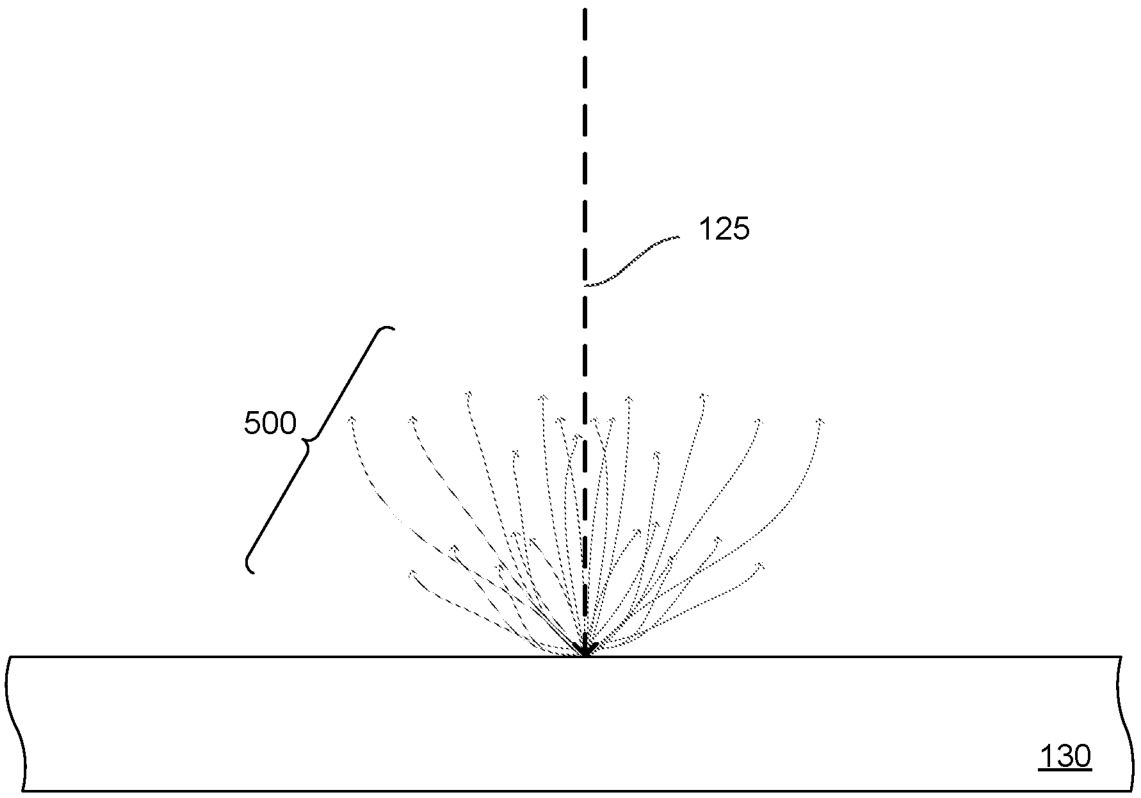
FIG. 5 is a simplified illustration of secondary electrons generated by collision of an ion beam with a sample.

The interaction of the ion beam with the sample 400 also generates secondary electrons, some of which are ejected from the sample towards the gas injection nozzle. For example, as shown in FIG. 5, the collision of ion beam 125 with sample 130 can generate secondary electrons 500 that are ejected from sample 130 along many different trajectories. The negative bias voltage applied to the gas injection nozzle by embodiments of the invention (block 330) during the deposition process can repel the ejected secondary electrons 500 back towards the sample surface causing additional dissociation events which, in turn, can lead to an increase in the deposition rate of the process as discussed below in conjunction with FIGS. 6A-6C.

In actual implementation, steps 350 and 360 can occur essentially simultaneously and very fast and steps 330 and 340 can be maintained (i.e., the negative voltage can be continuously applied to the gas injection nozzle and the deposition gas can be continuously introduced into the chamber) while the steps 350 and 360 are performed.

Once material from the precursor gas has been deposited in the first deposition sequence, if there are additional areas on the sample in which material is to be deposited (block 370), the sample can be moved via the substrate support to position a next or subsequent deposition area under the tip of the charged particle column (block 320). If not, the deposition process is complete and the sample can be transferred out of system 100 or otherwise processed (block 380).

While method 300 can be used to deposit many different types of materials and embodiments described herein are not limited to the use of any particular deposition precursor gas, as one specific example, the deposition precursor gas can be tungsten hexacarbonyl ($W(CO)_6$) that can be dissociated by the charged particle beam leaving a layer of tungsten material deposited on the sample within the localized deposition region.

Gas Injection Nozzle

Figure 6A:
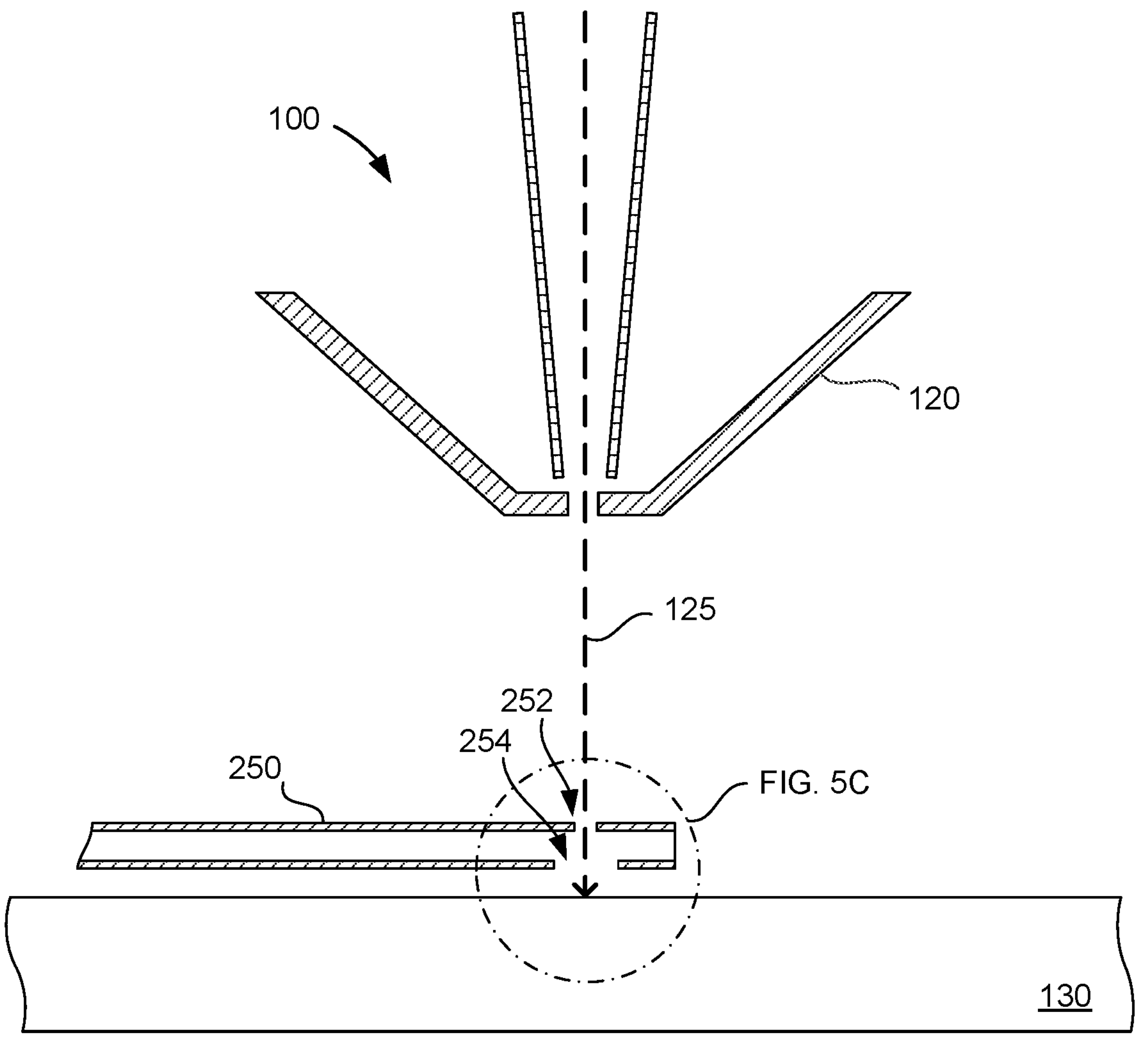
FIG. 6A is a simplified illustration of a portion of an FIB column and gas nozzle according to some embodiments.

Reference is now made to FIG. 6A which is a simplified illustration of a portion of the sample evaluation system shown in FIG. 2 in which only portions of FIB column 120, gas injection nozzle 250 and sample 130 are depicted. As shown, gas injection nozzle 250 includes a channel 252 that extends all the way through the nozzle 250, from an upper surface of nozzle 250 to a lower surface of the nozzle. Channel 252 can have a circular cross-section and can be centered around ion beam 125 such that the ion beam traverses through channel 252 of the gas injection nozzle 250 before impinging upon sample 130 (e.g., in region 600 shown in FIG. 6B). Nozzle 250 also includes an opening 254 at a bottom surface of the nozzle adjacent to an upper surface of sample 130. Gases that flow through nozzle 250 can be distributed to the surface of sample 130 through the opening 254.

Figure 6B:
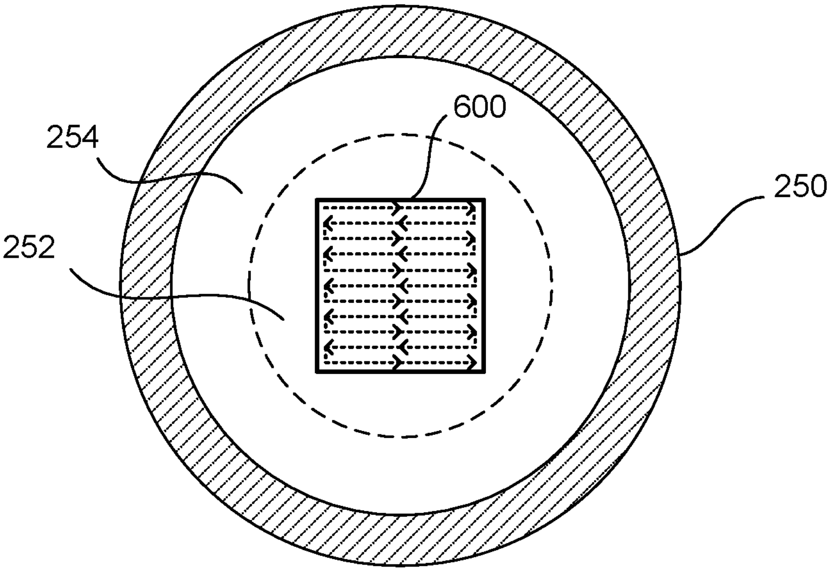
FIG. 6B is a simplified plan view illustration depicting a portion of the gas injection nozzle shown in FIG. 6A positioned over a sample.
Figure 6C:
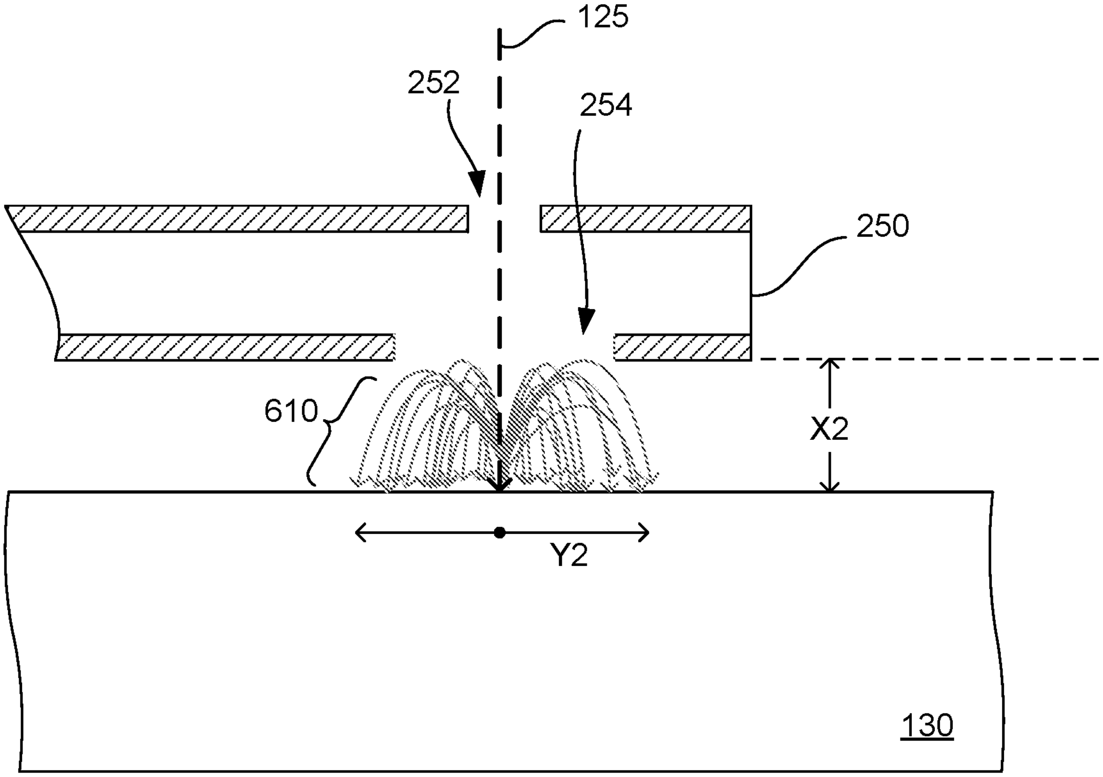
FIG. 6C is a simplified illustration of a gas injection nozzle according to some embodiments positioned over a sample.

FIG. 6B is a simplified illustration of a portion of nozzle 250 looking through opening 254 to sample 130. As shown in FIG. 6B, the opening 620 can also have a circular cross-section that encompasses channel 252 and symmetrically surrounds the region 600 on sample 130 in which ion beam 125 collides with the sample. In this manner, gases delivered by nozzle 250 can be delivered directly to the deposition region 600 of sample 130.

As shown in FIGS. 2 and 6A, gas injection nozzle 250 is much closer to sample 130 than the tip of FIB column. For example, nozzle 250 can be an order of magnitude or more closer to the deposition region on the upper surface of sample 130 than the closest portion of focused ion beam column is to the deposition region. In some embodiments, the lower surface of nozzle 250 can be spaced a distance X2 (shown in FIG. 6C) that is measured in tens or hundreds of microns away from the upper surface of sample 130. As a non-limiting example, in some charged particle deposition operations, the lower surface of nozzle 250 can be spaced about 200-700 microns away from the sample surface.

In previously known systems, substrate support 130 and gas nozzle 250 are typically electrically grounded. Embodiments disclosed herein, however, apply a negative voltage to gas injection nozzle 250 to repel secondary electrons generated during the charged particle deposition operation back to the sample. To illustrate reference is made to FIG. 6C, which is a simplified illustration of a portion of gas injection nozzle 250 positioned over a sample 130 while an ion beam 125 bombards the sample.

The design of gas nozzle 250, which completely and symmetrically surrounds the milled region as shown in FIG. 6B, and the extremely close spacing (micron range) between gas nozzle 250 and the sample can result in the repelled secondary electrons 610 being returned to sample 130 in a region centered around the milled region and having a radius of approximately Y2 measured in tens of microns as opposed to millimeters (and thus be at least an order of magnitude or two orders of magnitude or more less than Y1). Thus, the secondary electrons can be repelled back to an area on the sample that is within the same general vicinity (as measured in microns) as the deposition region which enables the repelled secondary electrons to interact with molecules of the deposition gas and cause additional dissociation events thereby increasing the rate at which material is deposited over sample 130.

In order to promote an increased deposition rate, the negative bias voltage applied to the gas injection nozzle should to be sufficiently high to repel secondary electrons that escape from a surface of the sample back to the sample, but it should not be so high as to impact the trajectory of ion beam 125 which would adversely impact the deposition process. In some embodiments, the negative bias voltage can be the minimum voltage that is required to repel a predetermined percent of the secondary electrons. Suitable values of the negative bias voltage will depend, in part, on the geometry of the gas injection nozzle, the spacing of nozzle to the sample and the predetermined percentage of secondary electrons that are to be repelled back into the sample. Suitable negative bias voltages can thus be determined by simulations or by experiments as can be readily determined by a person of skill in the art. In some embodiments, the bias voltage can be between negative 50 and negative 1000 volts; and in other embodiments the bias voltage can be between negative 100 and negative 500 volts.

Additional Embodiments

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. For example, while the embodiments above described a focused ion column as part of a tool having a single charged particle column, in some embodiments the focused ion beam column can be positioned within a SEM-FIB tool that has both a scanning electron microscope column and a focused ion beam column.

Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Also, where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of depositing material over a localized deposition region of a sample, the method comprising:

positioning a sample within a vacuum chamber such that the localized deposition region is under a field of view of a focused ion beam column;

injecting a deposition precursor gas, with a gas injection nozzle positioned between a tip of the focused ion beam column and the sample, the gas injection nozzle including a channel formed through a distal end of the gas injection nozzle and aligned to allow the focused ion beam to pass through the channel to the sample, into the vacuum chamber at a location adjacent to the deposition region;

generating a focused ion beam with the focused ion beam column and focusing the focused ion beam within the deposition region of the sample; and scanning the focused ion beam across the deposition region of the sample to activate molecules of the deposition gas that have adhered to the sample surface in the deposition region and deposit material on the sample within the deposition region; and applying, while material is being deposited within the deposition region by scanning the focused ion beam across the deposition region, a negative bias voltage to the gas injection nozzle to alter a trajectory of secondary electrons generated by interaction of the focused ion beam with the sample and repel the secondary electrons back toward a portion of the sample surface directly beneath the channel of the gas injection nozzle and within the deposition region of the sample, thereby increasing the rate of precursor gas dissociation and enhancing the rate of material deposition on the sample within the deposition region.

2. The method set forth in claim 1 wherein applying a negative bias voltage to the gas injection nozzle applies a voltage of between negative 50 and negative 1000 volts.

3. The method set forth in claim 1 wherein applying a negative bias voltage to the gas injection nozzle applies a voltage of between negative 100 and negative 500 volts.

4. The method set forth in claim 1 wherein the sample is a semiconductor wafer.

5. The method set forth in claim 1 wherein, while the negative bias voltage is applied to the gas injection nozzle to enhance the rate of material deposition on the sample, a lower surface of the gas injection nozzle is spaced between 200-700 microns away from an upper surface of the sample.

* * * * *